US011567229B2

(12) United States Patent
Mader

(10) Patent No.: US 11,567,229 B2
(45) Date of Patent: Jan. 31, 2023

(54) DETECTOR FOR DETECTING ELECTRICALLY CONDUCTIVE MATERIAL

(71) Applicant: Frauscher Sensortechnik GmbH, St. Marienkirchen (AT)

(72) Inventor: Günther Mader, Altheim (AT)

(73) Assignee: Frauscher Sensortechnik GmbH, St. Marienkirchen (AT)

(*) Notice: Subject to any disclaimer, the term of this patent is extended or adjusted under 35 U.S.C. 154(b) by 66 days.

(21) Appl. No.: 17/261,552

(22) PCT Filed: Apr. 24, 2019

(86) PCT No.: PCT/EP2019/060515
§ 371 (c)(1),
(2) Date: Jan. 19, 2021

(87) PCT Pub. No.: WO2020/015876
PCT Pub. Date: Jan. 23, 2020

(65) Prior Publication Data
US 2021/0263180 A1 Aug. 26, 2021

(30) Foreign Application Priority Data

Jul. 20, 2018 (EP) .................................. 18184723

(51) Int. Cl.
G01V 3/10 (2006.01)
H03K 17/95 (2006.01)

(52) U.S. Cl.
CPC ......... G01V 3/104 (2013.01); H03K 17/9525 (2013.01); H03K 2017/9527 (2013.01)

(58) Field of Classification Search
None
See application file for complete search history.

(56) References Cited

U.S. PATENT DOCUMENTS

| 4,084,135 A | 4/1978 | Enabnit | |
| 2007/0145830 A1* | 6/2007 | Lee | H02J 7/025 |
| | | | 307/135 |
| 2016/0290833 A1* | 10/2016 | Wang | G01D 5/2225 |

FOREIGN PATENT DOCUMENTS

| DE | 102010009576 | 11/2010 |
| EP | 0901002 | 3/1999 |
| EP | 2493076 A1 | 8/2012 |
| EP | 2555019 | 2/2013 |
| EP | 2562565 | 2/2013 |
| RU | 2251126 C1 | 4/2005 |
| RU | 56005 U1 | 8/2006 |

(Continued)

Primary Examiner — Daniel C Puentes
(74) Attorney, Agent, or Firm — Morgan, Lewis & Bockius LLP

(57) ABSTRACT

A detector (10) for detecting electrically conductive material is provided. The detector (10) comprises at least one transmitter (11) having a transmitter coil (12) and a supply source (13), a receiver (14) having a receiver coil (15), and an evaluation unit (16), wherein the transmitter coil (12) is connected to the supply source (13), the supply source (13) is configured to provide an alternating voltage or an alternating current when in use, the receiver (14) is designed as a resonant-circuit-free receiver, the receiver (14) is connected to the evaluation unit (16), and the evaluation unit (16) is configured to detect a signal induced in the receiver coil (15).

18 Claims, 7 Drawing Sheets

(56) References Cited

FOREIGN PATENT DOCUMENTS

| | | |
|---|---|---|
| RU | 2421760 C1 | 6/2011 |
| RU | 2559796 C2 | 8/2015 |
| RU | 2595644 C2 | 8/2016 |
| WO | WO 2007/136966 | 11/2007 |

* cited by examiner

DETECTOR FOR DETECTING ELECTRICALLY CONDUCTIVE MATERIAL

A detector for detecting electrically conductive material is provided.

Metal detectors can be used to detect moving metallic objects. For this purpose, a metal detector may have an oscillating circuit with one or more coils. The movement of a metallic object in the magnetic field of the coil(s) leads to a change in the impedance of the coil(s). If there are several coils, the movement of a metallic object in the vicinity of the coils also causes a change in the coupling of the coils. Due to the fact that the coil(s) is/are arranged in an oscillating circuit, even a low excitation results in high oscillation amplitudes at which changes can be easily detected. However, it is also possible that other factors such as temperature influences or component aging lead to a change in the amplitude. This is why metal detectors, which are exposed to large temperature differences or have been used over a long period of time, may exhibit large inaccuracies in the detection of metallic objects.

One task to be solved is to provide a detector for detecting electrically conductive material, which can be operated efficiently.

The task is solved by the object of the independent claim. Advantageous embodiments and further developments are set forth in the sub-claims.

According to at least one embodiment of the detector for detecting electrically conductive material, the detector comprises at least one transmitter having a transmitter coil and a supply source. The supply source may be a voltage source or a current source. The transmitter coil may include an electrically conductive material. The transmitter coil may be electrically connected to the supply source. The supply source is configured to provide an alternating voltage or an alternating current when in use. The amplitude and frequency of the alternating voltage can be specified in advance.

The detector also comprises a receiver having a receiver coil. The receiver coil may include an electrically conductive material. The transmitter and the receiver can be arranged to be separate from each other. This can mean that the transmitter and the receiver are not connected by, for example, a cable or other electrically conductive connection.

The detector also comprises an evaluation unit. The evaluation unit is configured to detect a signal induced in the receiver coil. The signal may be an electrical voltage or an electrical current. The receiver is connected to the evaluation unit. The receiver may be electrically connected to the evaluation unit. The evaluation unit may be a signal evaluation unit. The evaluation unit may be configured to measure a voltage or a current. By way of example, the evaluation unit may have a first input and a second input. The receiver coil may have a first terminal and a second terminal, with the second terminal being located on the side of the receiver coil facing away from the first terminal. Each of the terminals of the receiver coil can be electrically connected to one of the inputs of the evaluation unit. The evaluation unit may be configured to measure the voltage applied across the receiver coil. The evaluation unit can also be configured to provide the value of the measured voltage at an output of the evaluation unit.

The receiver is designed as a resonant-circuit-free receiver. This means that the receiver is a resonant-circuit-free receiver. Furthermore, the receiver is not operated as an oscillating circuit during use of the detector. The receiver coil can be directly connected to the evaluation unit. This can mean that each of the terminals of the receiver coil has a direct electrical connection to one of the inputs of the evaluation unit.

The detector described here is based on the idea, among other things, that electrically conductive material can be detected in the vicinity of the detector. If the receiver coil is placed in a magnetic field, a voltage can be induced in the receiver coil when the magnetic field changes. The magnetic field can change, for example, if an electrically conductive material moves in the magnetic field. The detector can also be used to detect ferromagnetic material, since the magnetic field can also change if a ferromagnetic material moves in the magnetic field. The evaluation unit is configured to detect the signal induced in the receiver coil, for example a voltage. Thus a change in the voltage induced in the receiver coil indicates that an electrically conductive material, an electrically conductive object, a ferromagnetic material or a ferromagnetic object is moving in the magnetic field or is approaching the detector.

Since the receiver is designed as a resonant-circuit-free receiver, it is preferred that the receiver does not have a resonant frequency. In an oscillating circuit, the amplitude of the voltage induced in a coil of the oscillating circuit can depend in a non-linear manner on the induced voltage as well as on other parameters such as temperature influences or component aging. In contrast to this, the amplitude of the voltage induced in the receiver coil described here depends only on the inductance of the receiver coil. The dependence of the amplitude of the voltage induced in the receiver coil on the inductance of the receiver coil may be square root-like. The inductance of the receiver coil depends on the geometry of the receiver coil and on materials, which are magnetic or electrically conductive, in the vicinity of the receiver coil. Since the geometry of the receiver coil does not change or changes only slightly in most cases during use of the detector, the amplitude of the voltage induced in the receiver coil depends only on materials in the vicinity of the receiver coil.

Thus, the detector described here allows a more accurate measurement of the voltage induced in the receiver coil with little or no influence of temperature or component aging on measuring the induced voltage. A readjustment of parameters of the transmitter or the receiver in use of the detector is not necessary.

Furthermore, it is advantageous that no exact adjustment of parameters of an oscillating circuit or of two coupled oscillating circuits is necessary, because the receiver is a resonant-circuit-free receiver.

It is also feasible to use a receiver coil with an as high an inductance as possible. The higher the inductance of the receiver coil, the higher the voltage induced in the receiver coil. The higher the voltage induced in the receiver coil, the easier and more accurate the induced voltage can be detected and measured by the evaluation unit. The quality of the receiver coil used is not decisive for the accuracy of measuring the induced voltage, because the receiver coil is not used in an oscillating circuit. Therefore, a receiver coil with the highest possible inductance can be used without regard to the quality level of the receiver coil. Advantageously, coils arranged on a printed circuit board (so-called "printed circuit board PCB coils") can be used as receiver coil. The evaluation unit should have a high input impedance here.

The detector described here can be used, for example, as a wheel detector on rails to detect the wheels of a train. In this context, the detector can be arranged in such a way that a wheel of a train moves in a magnetic field when the train passes the position of the detector and that the movement of the wheel in the magnetic field changes a voltage induced in the receiver coil. The voltage induced in the receiver coil and its change can be detected by the evaluation unit. Thus, the evaluation unit can detect that a train passes the position of the detector.

According to at least one embodiment of the detector, the alternating voltage provided by the supply source or the alternating current provided by the supply source is coupled into the transmitter coil during use. The supply source may have a first output and a second output. Between the first output and the second output, the provided alternating voltage can be present. The transmitter coil may have a first terminal and a second terminal, wherein the second terminal is located on the side of the transmitter coil facing away from the first terminal. Each of the terminals of the transmitter coil may be electrically connected to one output of the supply source. Thus, the alternating voltage provided by the supply source during use or the alternating current provided by the supply source is coupled into the transmitter coil.

According to at least one embodiment of the detector, the transmitter coil generates a transmitter magnetic field by applying a voltage or a current to the transmitter coil. By way of example, the transmitter coil can generate a transmitter magnetic field if the alternating voltage provided by the supply source is applied to the transmitter coil. The transmitter magnetic field can depend on the frequency of the alternating voltage and parameters of the transmitter coil. The transmitter magnetic field may be used as a magnetic field to detect metallic or ferromagnetic objects in the transmitter magnetic field.

According to at least one embodiment of the detector, the transmitter coil and the receiver coil are arranged in such a way that a transmitter magnetic field generated by the transmitter coil induces a signal in the receiver coil. The signal may be an electrical voltage or an electrical current. This can mean that the receiver coil is located in the transmitter magnetic field. It is also possible that the transmitter coil and the receiver coil are arranged in such a way that the transmitter magnetic field generated by the transmitter coil induces a signal in the receiver coil, which can be detected by the evaluation unit. Thus, the receiver coil can be located in the vicinity of the transmitter coil. The distance between the receiver coil and the transmitter coil is less than 1 m or less than 20 cm, for instance. The transmitter coil and the receiver coil may be arranged in such a way that they are coupled with each other. If the transmitter magnetic field changes, the signal induced in the receiver coil changes as well. This allows the detection of electrically conductive or ferromagnetic material in the transmitter magnetic field.

According to at least one embodiment of the detector, the coupling between the transmitter coil and the receiver coil is less than 5%. The coupling between the transmitter coil and the receiver coil may be less than 1%. The greater the coupling between the transmitter coil and the receiver coil, the greater the voltage induced in the receiver coil. In the case of a low coupling between the transmitter coil and the receiver coil, changes in the coupling between the transmitter coil and the receiver coil due to a movement of electrically conductive and/or ferromagnetic material in the transmitter magnetic field, in relation to the coupling without influence, have a greater effect on the voltage induced in the receiver coil than in the case of higher coupling.

According to at least one embodiment of the detector, the signal induced in the receiver coil depends on electrically conductive material in the vicinity of the receiver coil. The transmitter magnetic field depends on electrically conductive material in the transmitter magnetic field. For example, the transmitter magnetic field changes if electrically conductive material moves in the transmitter magnetic field or if electrically conductive material moves into the transmitter magnetic field. A change of the transmitter magnetic field also changes the signal induced in the receiver coil. Thus, the signal induced in the receiver coil depends on whether electrically conductive material moves in the transmitter magnetic field and hence in the vicinity of the receiver coil. This also applies to ferromagnetic material.

This is why the detector can be used for detecting electrically conductive material. Electrically conductive material can be detected in the area of the transmitter magnetic field. If an electrically conductive object, such as a wheel of a train, moves into the transmitter magnetic field, the signal induced in the receiver coil changes. In this case, the transmitter coil and the electrically conductive object are inductively coupled. The change of the signal induced in the receiver coil can be detected by the evaluation unit and thus indicates the presence of an electrically conductive object in the transmitter magnetic field. The detector can be placed on a rail, for instance, and can be configured to detect a train at the position of the detector by detecting the presence of a wheel of a train, with the wheel comprising an electrically conductive or a ferromagnetic material.

According to at least one embodiment of the detector, the evaluation unit is configured to provide an output signal that depends on a change of the signal induced in the receiver coil. The output signal can be provided at the output of the evaluation unit. The signal induced in the receiver coil may change if an electrically conductive material or a ferromagnetic material moves in the transmitter magnetic field. Thus, the output signal may contain the information that an electrically conductive material or a ferromagnetic object has been detected in the transmitter magnetic field. The detector can therefore be used for detecting electrically conductive or ferromagnetic material.

According to at least one embodiment of the detector, the evaluation unit is configured to determine the amplitude and/or phase of the signal induced in the receiver coil. This can mean that the evaluation unit is configured to determine the value of the voltage or current induced in the receiver coil. The evaluation unit may be configured to determine the amplitude and/or the phase of the signal induced in the receiver coil continuously or in predeterminable time intervals. Thus, a change of the signal induced in the receiver coil can be detected.

According to at least one embodiment of the detector, the evaluation unit is configured to determine the phase of the signal induced in the receiver coil. By comparing the phase of the voltage induced in the receiver coil with the phase of the voltage applied to the transmitter coil, conclusions can be drawn regarding losses, such as eddy current losses, in the transmitter magnetic field, or regarding external disturbances.

According to at least one embodiment of the detector, the detector comprises an additional transmitter having an additional transmitter coil and an additional supply source. The additional transmitter may have the same construction as the transmitter. The transmitter and the additional transmitter can be placed at a distance from each other. The transmitter and the additional transmitter can be placed at about the same distance from the receiver. The additional supply source may be a voltage source or a current source.

According to at least one embodiment of the detector, the additional supply source, when in use, is configured to provide an alternating voltage or an alternating current, the frequency of which differs from the frequency of the alternating voltage provided by the supply source or from the alternating current provided by the supply source. The alternating voltage or alternating current provided by the additional supply source in use may have a greater frequency or a smaller frequency than the alternating voltage or the alternating current provided by the supply source in use. By coupling the alternating voltage or alternating current provided by the additional supply source into the additional transmitter coil, an additional transmitter magnetic field is created. The additional transmitter coil and the receiver coil may be arranged in such a way that an additional transmitter magnetic field generated by the additional transmitter coil induces a voltage in the receiver coil. Thus, the additional supply source enables the detection of electrically conductive material with an additional frequency of the alternating voltage, which generates the additional transmitter magnetic field. By using two transmitters with different frequencies, interference at certain frequencies can be determined and undesired frequency ranges can be avoided.

The transmitter and the additional transmitter can be operated simultaneously. Therefore, electrically conductive material can be detected simultaneously at different frequencies. This is advantageous, for example, if an external or internal interference frequency occurs in a frequency range. In this case, the respectively other transmitter can be used, in which the interference frequency is not in the range of the frequency of the provided alternating voltage. It is also possible to determine the interference by comparing the two voltages induced in the receiver coil. Thus, the detector can be operated more reliably and the accuracy can be improved.

According to at least one embodiment of the detector, the transmitter has a capacitor which forms an oscillating circuit with the transmitter coil. The capacitor may be electrically connected in parallel with the transmitter coil. The oscillating circuit may have a resonant frequency. It is also possible that the oscillating circuit has at least two resonant frequencies. The resonant frequency or the resonant frequencies of the oscillating circuit may be adjustable. The alternating voltage provided by the supply source may be equal or approximately equal to the resonant frequency or one of the resonant frequencies of the oscillating circuit. The closer the frequency of the provided alternating voltage is to the resonant frequency of the oscillating circuit, the greater the current intensity in the transmitter coil. If the frequency of the alternating voltage supplied by the supply source is equal or approximately equal to the resonant frequency or one of the resonant frequencies of the oscillating circuit, the oscillating circuit can be excited efficiently. The higher the current intensity in the transmitter coil, the higher the magnetic field strength of the transmitter magnetic field. A large magnetic field strength of the transmitter magnetic field can improve the accuracy of the detection of the signal induced in the receiver coil.

According to at least one embodiment of the detector, the receiver has an additional receiver coil. The additional receiver coil may have the same construction as the receiver coil. The additional receiver coil may have a first terminal and a second terminal, wherein the second terminal is located on the side of the additional receiver coil facing away from the first terminal. The evaluation unit may have a third input and a fourth input. The first terminal of the additional receiver coil can be electrically connected to the third input of the evaluation unit and the second terminal of the additional receiver coil can be electrically connected to the fourth input of the evaluation unit. Alternatively, it is also possible that the first terminal of the additional receiver coil is electrically connected to the fourth input of the evaluation unit and the second terminal of the additional receiver coil is electrically connected to the third input of the evaluation unit.

According to at least one embodiment of the detector, the receiver coil and the additional receiver coil have the same construction. By way of example, the receiver coil and the additional receiver coil may have the same number of turns. It is also possible that the receiver coil and the additional receiver coil have the same size and the same cross-section. The receiver coil and the additional receiver coil can be made of the same material.

According to at least one embodiment of the detector, the receiver coil and the additional receiver coil have the same winding direction. If the signals of the receiver coil and the additional receiver coil are subtracted from each other, common mode interferences can be suppressed.

According to at least one embodiment of the detector, the evaluation unit comprises a differential amplifier. The differential amplifier may have a first input and a second input. One of the terminals of the receiver coil can be electrically connected to the first input of the differential amplifier. One of the terminals of the additional receiver coil can be electrically connected to the second input of the differential amplifier. It is also possible that one of the terminals of the receiver coil is electrically connected to the second input of the differential amplifier and one of the terminals of the additional receiver coil is electrically connected to the first input of the differential amplifier. The differential amplifier can be configured to subtract two signals received at the inputs.

If the receiver is placed in a homogeneous electrical interference field, the same voltages are coupled into the receiver coil and the additional receiver coil in a capacitive manner, because the receiver coil and the additional receiver coil have the same construction. In the differential amplifier, the coupled voltages are subtracted from each other. Since the same voltages are coupled into the receiver coil and the additional receiver coil in a capacitive manner, the coupled voltages compensate each other. This is especially the case if the receiver coil and the additional receiver coil have the same construction and the same winding direction. Thus, the use of the differential amplifier can reduce or prevent the capacitive coupling by homogeneous electrical interference fields.

If the receiver is placed in a homogeneous magnetic interference field, the same voltage is induced in the receiver coil and in the additional receiver coil, because the receiver coil and the additional receiver coil have the same construction and the same winding direction. In the differential amplifier, these induced voltages can be subtracted from each other. Since the same voltage is induced in the receiver coil and in the additional receiver coil, the induced voltages compensate each other. This is especially the case if the receiver coil and the additional receiver coil have the same construction and the same winding direction. Thus, inductive couplings of homogeneous magnetic interference fields can be suppressed or prevented by using the differential amplifier.

The differential amplifier may comprise a bandpass filter. Here, the frequency of the alternating voltage applied to the transmitter coil can be a pass frequency of the bandpass filter. Thus, only interference fields are suppressed, but not the signal to be detected.

The higher the common mode rejection of the differential amplifier and the higher the similarity of the construction, the more efficiently influences by homogeneous electrical or magnetic interference fields can be suppressed.

According to at least one embodiment of the detector, the differential amplifier is configured to provide an output signal that depends on the amplitude and phase of the signal induced in the receiver coil and on the amplitude and phase of the signal induced in the additional receiver coil. This can mean that after subtraction of influences of possible interference fields, the output signal depends on the amplitude and phase of the signal induced in the receiver coil and on the amplitude and phase of the signal induced in the additional receiver coil.

According to at least one embodiment of the detector, the receiver coil and the additional receiver coil each have one of their ends connected to a differential amplifier and the other end connected to a reference potential or a voltage supply. This allows the suppression of influences by homogeneous electric or magnetic interference fields.

According to at least one embodiment of the detector, a controller is connected to the differential amplifier. The controller can be configured to control the voltage supplies, to which the receiver coil and the additional receiver coil are connected, in such a way that the output signal of the differential amplifier is always zero. For this purpose, a control signal is determined in the controller. The control signal depends on the signal to be detected by the receiver. Thus, the signal to be detected can be determined from the control signal.

According to at least one embodiment of the detector, the receiver coil has the shape of a figure eight with two coil halves. This means that the receiver coil can be an eight-shape coil. If such a coil is arranged in a homogeneous magnetic interference field, the same voltage with different sign is induced in both coil halves. Thus, advantageously, the two induced voltages compensate each other.

In the following, the detector described here is explained in more detail in connection with exemplary embodiments and the corresponding Figures.

Figure 1:
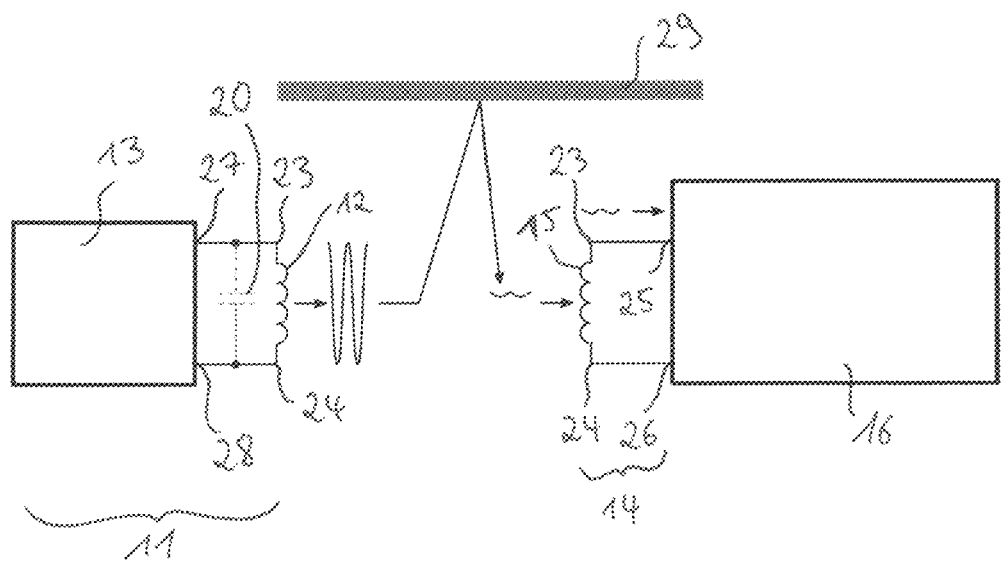
FIGS. 1 and 2 show exemplary embodiments of the detector for detecting electrically conductive material.

FIG. 1 schematically shows an exemplary embodiment of a detector 10 for detecting electrically conductive material. The detector 10 comprises a transmitter 11 having a transmitter coil 12 and a supply source 13. The supply source 13 may be a voltage source or a current source. The transmitter coil 12 is electrically connected to the supply source 13. The supply source 13 has a first output 27 and a second output 28. The transmitter coil 12 has a first terminal 23 and a second terminal 24, with the second terminal 24 being located on the side of the transmitter coil 12 facing away from the first terminal 23. The first terminal 23 of transmitter coil 12 is electrically connected to the first output 27 of supply source 13. The second terminal 24 of transmitter coil 12 is electrically connected to the second output 28 of supply source 13. The supply source 13 is configured to provide an alternating voltage or an alternating current during use. The alternating voltage or alternating current provided by the supply source 13 in use is coupled into the transmitter coil 12. The transmitter coil 12 generates a transmitter magnetic field by applying the alternating voltage to the transmitter coil 12.

Optionally, the transmitter 11 has a capacitor 20, which forms an oscillating circuit with the transmitter coil 12. Since the capacitor 20 is optional, it is shown as a dashed line in FIG. 1. The capacitor 20 is electrically connected in parallel to the transmitter coil 12.

Adjacent to the transmitter coil 12, it is schematically shown that the transmitter magnetic field generated by the transmitter coil 12 has a magnetic field strength that varies with time. In addition, an electrically conductive or ferromagnetic object 29, which is located in the area of the transmitter magnetic field, is shown schematically. In this case, the transmitter coil 12 and the object 29 are inductively coupled.

The detector 10 further comprises a receiver 14 having a receiver coil 15. The detector 10 also has an evaluation unit 16. The receiver 14 is connected to the evaluation unit 16 and the receiver 14 is designed as a resonant-circuit-free receiver. The receiver coil 15 has a first terminal 23 and a second terminal 24, with the second terminal 24 being located on the side of the receiver coil 15 facing away from the first terminal 23. The evaluation unit 16 has a first input 25 and a second input 26. The first terminal 23 of the receiver coil 15 is electrically connected to the first input 25 of the evaluation unit 16. The second terminal 24 of the receiver coil 15 is electrically connected to the second input 26 of the evaluation unit 16. The evaluation unit 16 is configured to detect a signal induced in the receiver coil 15, for example an electrical voltage or an electrical current.

As shown in FIG. 1, the transmitter coil 12 and the receiver coil 15 are arranged in such a way that the transmitter magnetic field generated by the transmitter coil 12 induces a voltage in the receiver coil 15. The voltage induced in the receiver coil 15 depends on whether an electrically conductive material or a ferromagnetic material is located or moving in the area of the transmitter magnetic field. It is shown schematically that an alternating voltage is induced in the receiver coil 15, whose amplitude is much lower than the amplitude of the alternating voltage provided by the supply source 13. The coupling of the transmitter coil 12 with the receiver coil 15 can be less than 5%, for instance. Therefore, the evaluation unit 16 should be sensitive enough to detect small voltages.

The evaluation unit 16 is configured to determine the amplitude and/or phase of the voltage induced in the receiver coil 15. Furthermore, the evaluation unit 16 may be configured to provide an output signal that depends on a change in the voltage induced in the receiver coil 15. Since the receiver 14 is designed as a resonant-circuit-free receiver, the amplitude and phase of the voltage induced in the receiver coil 15 depend only on the inductance of the receiver coil 15. In contrast, in an oscillating circuit, temperature changes or component aging can have an influence on the voltage induced in a coil. The advantage of the detector 10 described here is that the amplitude and phase of the voltage induced in the receiver coil 15 depend only slightly or negligibly on temperature changes or component aging and mainly on the amplitude and phase of the voltage which is to be measured and is induced in the receiver coil 15.

Figure 2:
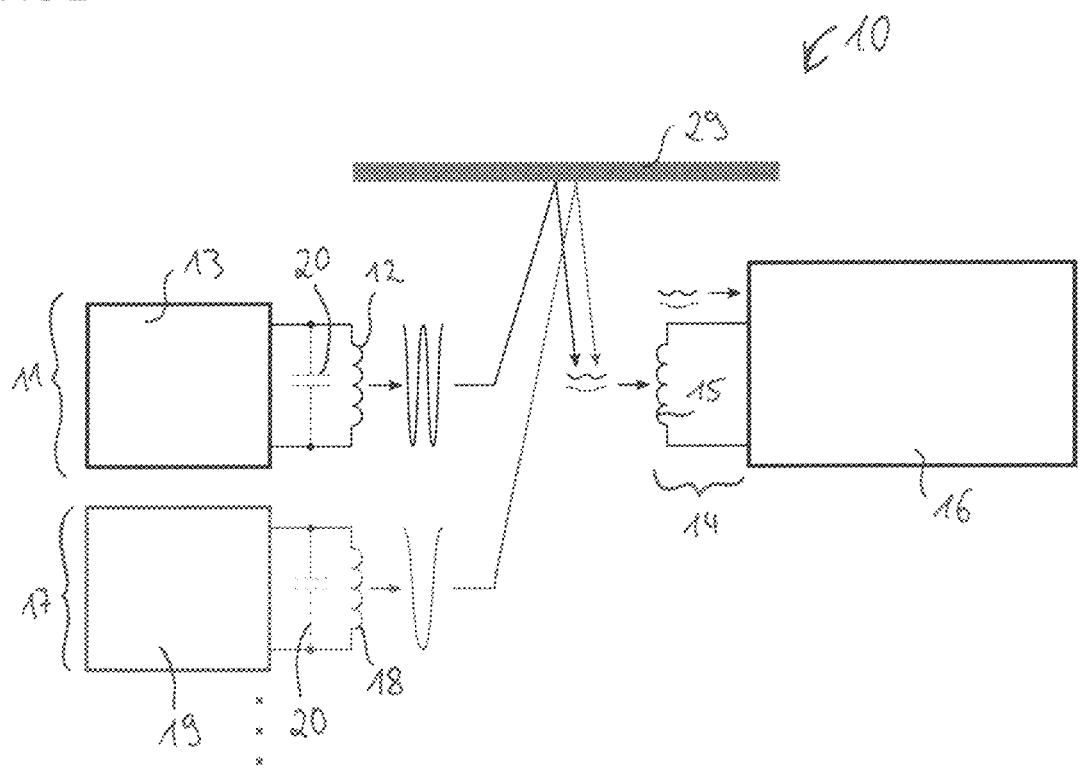

FIG. 2 shows an additional example of the detector 10. In addition to the construction shown in FIG. 1, the detector 10 comprises an additional transmitter 17 having an additional transmitter coil 18 and an additional supply source 19. The additional transmitter 17 has the same construction as the transmitter 11. The transmitter 11 and the additional transmitter 17 differ in that the additional supply source 19 is configured to provide in use an alternating voltage or an alternating current whose frequency is different from the frequency of the alternating voltage or alternating current provided by the supply source 13 of the transmitter 11. FIG. 2 shows schematically that the alternating voltage provided by the additional supply source 19 has a lower frequency than the alternating voltage provided by the supply source 13. Thus, the transmitter magnetic field generated by the additional transmitter coil 18 induces a voltage in the receiver coil 15 which is detected by the evaluation unit 16.

The dots below the additional transmitter 17 indicate that the detector may have 10 additional transmitters 17.

Figure 3:
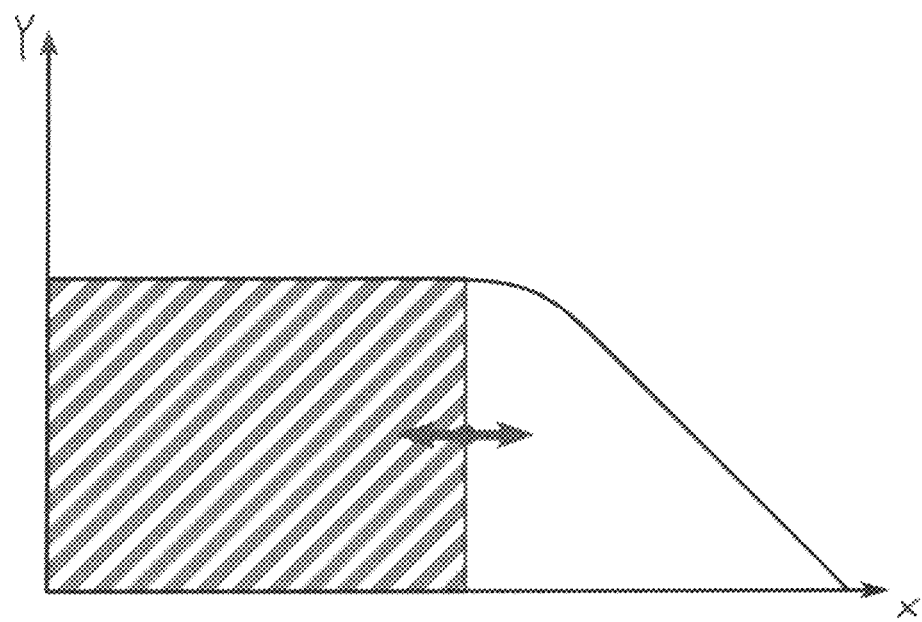
FIG. 3 shows the transfer function of a receiver.

FIG. 3 shows the transfer function of the receiver 14. On the x-axis, the frequency of the signal induced in the receiver coil 15 is plotted logarithmically in arbitrary units. On the y-axis, the amplitude of the signal induced in the receiver coil 15 is plotted logarithmically. It is preferred to use frequencies in the hatched area to determine the amplitude of the signal induced in the receiver coil 15. In this area, the signal induced in the receiver coil 15 depends on the inductance of the receiver coil 15. The induced signal may be an electrical voltage.

Figure 4:
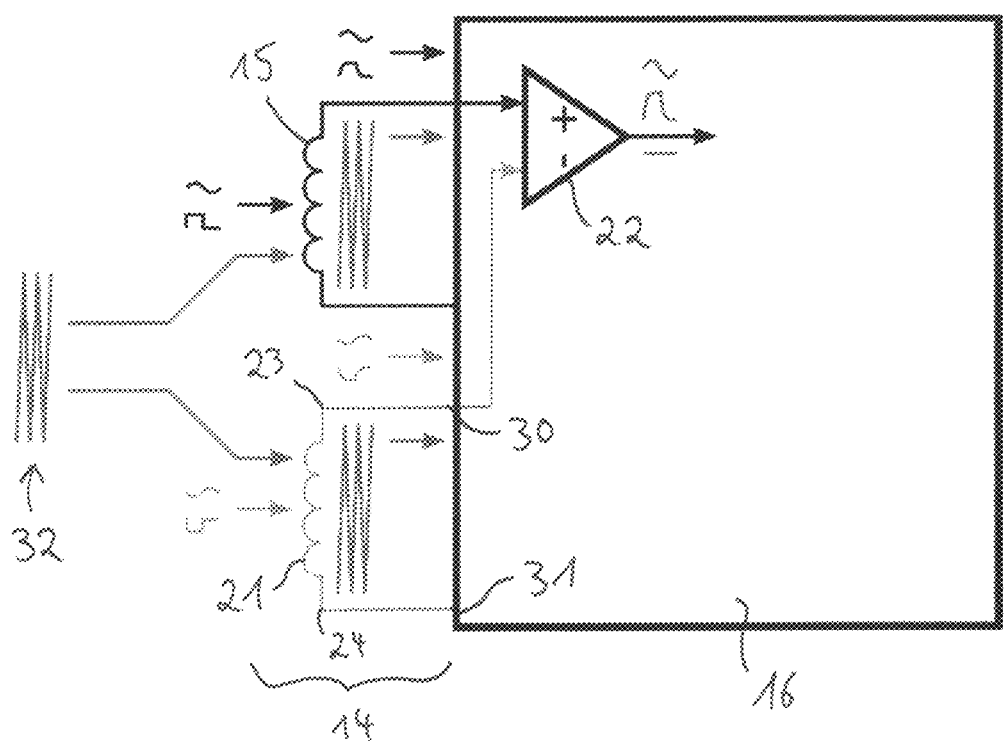
FIG. 4 shows an exemplary embodiment of a receiver having an evaluation unit.

FIG. 4 shows an exemplary embodiment of the receiver 14. The receiver 14 has the receiver coil 15 and an additional receiver coil 21. The receiver coil 15 and the additional receiver coil 21 have the same construction and the same winding direction. Similar to the receiver coil 15, the additional receiver coil 21 has a first terminal 23 and a second terminal 24, with the second terminal 24 being located on the side of the additional receiver coil 21 facing away from the first terminal 23. The evaluation unit 16 also has a third input 30 and a fourth input 31. The first terminal 23 of the additional receiver coil 21 is electrically connected to the third input 30 and the second terminal 24 of the additional receiver coil 21 is electrically connected to the fourth input 31. In addition, the evaluation unit 16 features a differential amplifier 22.

FIG. 4 shows schematically that a homogeneous interfering signal 32 may occur in the vicinity of the receiver 14. The homogeneous interfering signal 32 may occur, for example, due to a homogeneous electric or magnetic interference field. In the case of a homogeneous electric interference field, the same voltage is coupled into the receiver coil 15 and the additional receiver coil 21, since the receiver coil 15 and the additional receiver coil 21 have the same construction. In case of a homogeneous magnetic interference field, the same voltage is induced in the receiver coil 15 and the additional receiver coil 21, since the receiver coil 15 and the additional receiver coil 21 have the same construction and the same winding direction. In the differential amplifier 22, the coupled or induced voltages are subtracted from each other. Thus, the coupled or induced voltages compensate each other. The differential amplifier 22 is further configured to provide an output signal, with the output signal depending on the amplitude of the voltage induced in the receiver coil 15 and on the amplitude of the voltage induced in the additional receiver coil 21. It is advantageous to use the differential amplifier 22 to reduce or prevent any capacitive or inductive coupling by interference fields.

Advantageously, the voltages induced in the receiver coil 15 and the additional receiver coil 21 by the movement of an electrically conductive or ferromagnetic material do not compensate each other. The receiver coil 15 and the additional receiver coil 21 are arranged in the transmitter magnetic field in such a way that the voltages induced by a change of the transmitter magnetic field in the receiver coil 15 and the additional receiver coil 21 do not compensate each other. Therefore, the receiver coil 15 and the additional receiver coil 21 are arranged side by side. The transmitter magnetic field can be inhomogeneous so that the voltages induced in the receiver coil 15 and the additional receiver coil 21 do not compensate each other.

Figure 5:
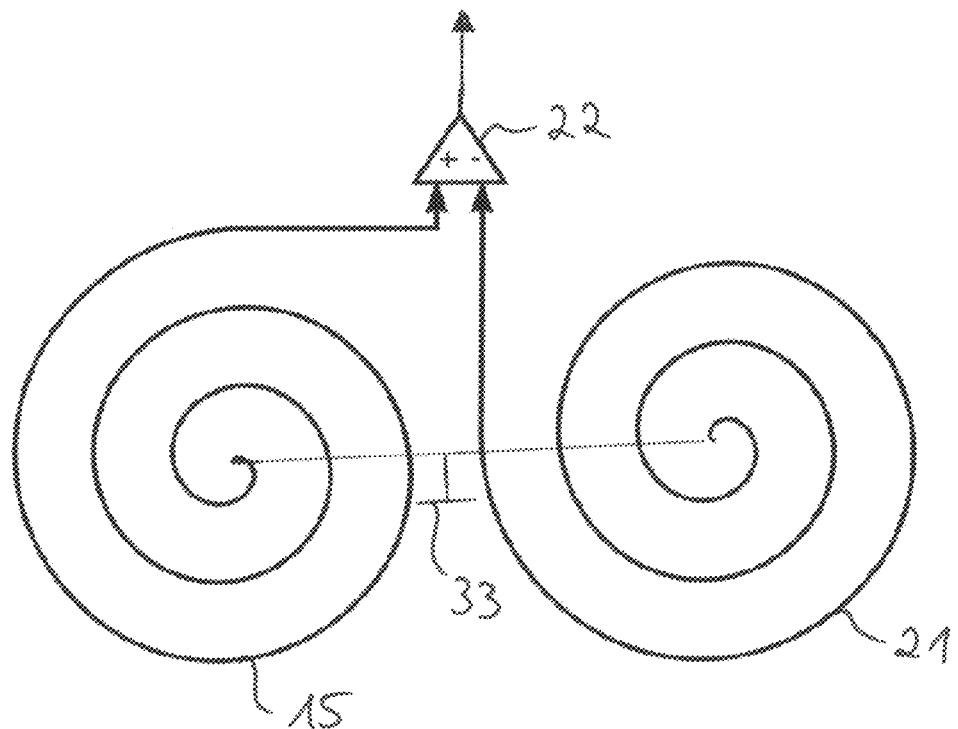
FIGS. 5, 6, 7, 8, 9, 10, 11, 12 and 13 show exemplary embodiments of the receiver coil and the additional receiver coil.

FIG. 5 shows an exemplary embodiment of the receiver coil 15 with the additional receiver coil 21. The receiver coil 15 and the additional receiver coil 21 have the same construction and the same winding direction. Furthermore, the receiver coil 15 and the additional receiver coil 21 are both connected to the differential amplifier 22. The respective other ends of the receiver coil 15 and of the additional receiver coil 21 are connected to a reference potential 33. The reference potential 33 is a grounding, for instance. This means that the receiver coil 15 is connected at one of its ends to the differential amplifier 22 and at its other end to the reference potential 33. The additional receiver coil 21 is connected at one of its ends to the differential amplifier 22 and at its other end to the reference potential 33. The receiver coil 21 is connected at its end, which is connected to the reference potential 33, to the end of the additional receiver coil 21, which is also connected to the reference potential 33. The differential amplifier 22 is configured to subtract the two received voltages from each other. The receiver coil 15 and the additional receiver coil 21 are arranged side by side in the transmitter magnetic field.

Figure 6:
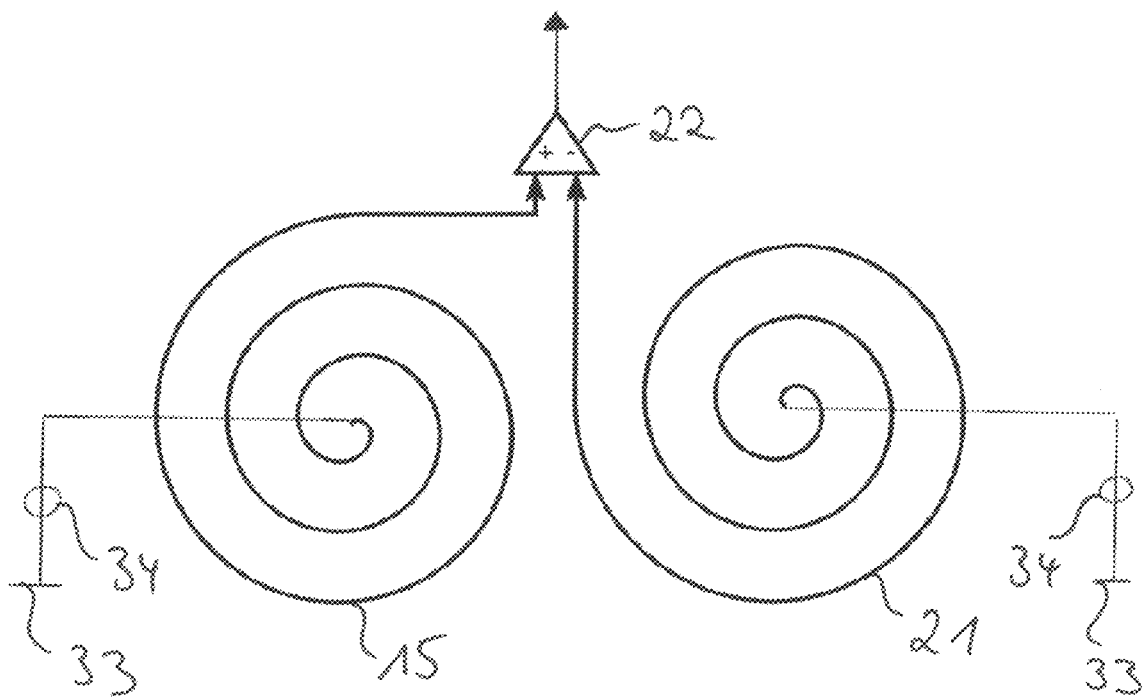

FIG. 6 shows an additional exemplary embodiment of the receiver coil 15 with the additional receiver coil 21. The receiver coil 15 and the additional receiver coil 21 have the construction shown in FIG. 5 and are connected to the differential amplifier 22 as in the exemplary embodiment in FIG. 5. The respective other ends of the receiver coil 15 and of the additional receiver coil 21 are each connected to a voltage source 34. The voltage sources 34 are each connected to a reference potential 33. The receiver 14 can be operated in such a way that the two voltage sources 34 each provide the same DC voltage and each deliver this voltage to the receiver coil 15 and the additional receiver coil 21. Alternatively, it is possible that the ends of the receiver coil 15 and the additional receiver coil 21, which are not connected to the differential amplifier 22, are connected to only one common voltage source 34. It is also possible that the receiver 14 is operated in such a way that the two voltage sources 34 each provide an alternating voltage and the receiver coil 15 and the additional receiver coil 21 are each supplied with this voltage. The frequency of this alternating voltage can be the same as the frequency of the alternating voltage applied across the transmitter coil 12. In this way, slight differences between the receiver coil 15 and the additional receiver coil 21 can be compensated for.

Figure 7:
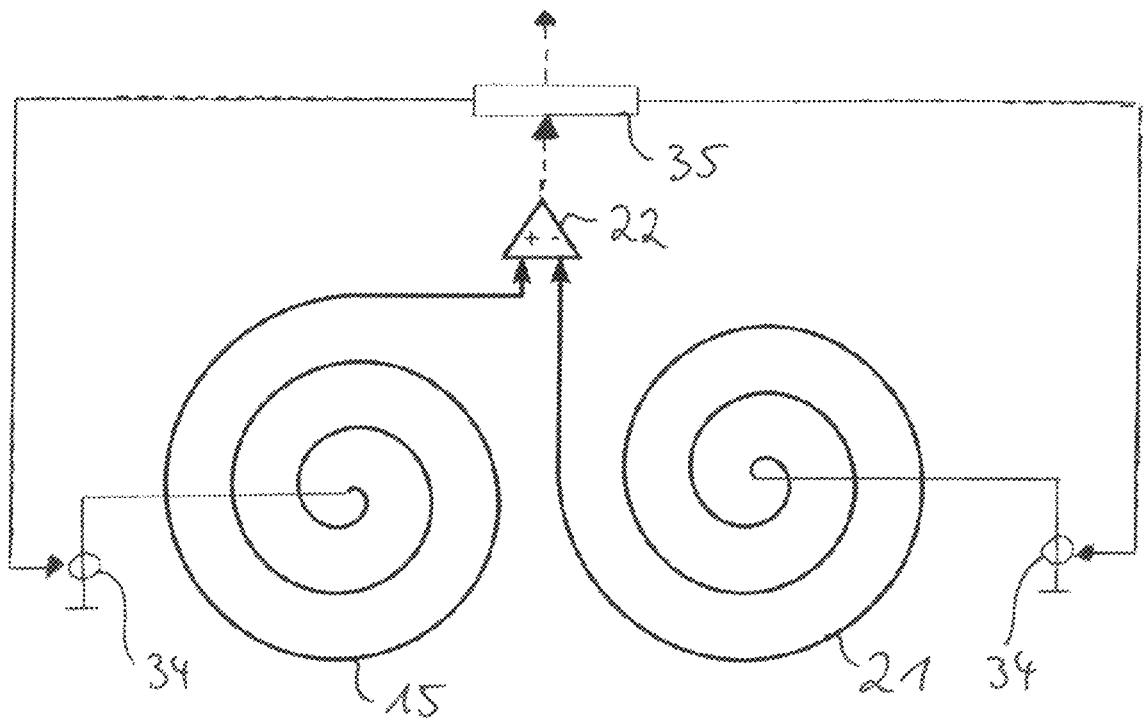

FIG. 7 shows an additional exemplary embodiment of the receiver coil 15 with the additional receiver coil 21. In comparison to the exemplary embodiment shown in FIG. 6, the differential amplifier 22 is connected to a controller 35. The controller 35 is connected to the two voltage sources 34 and is configured to adjust the voltage they provide. The receiver 14 can be operated such that the output signal of the differential amplifier 22 is always zero. This is achieved by the controller 35 adjusting the voltages provided by the voltage sources 34 such that the output signal of the differential amplifier 22 is zero, in the event that the output signal of the differential amplifier 22 is different from zero. In this case, the control signal of the controller 35 corresponds to the signal to be detected. The use of the controller 35 is advantageous because temperature influences on the differential amplifier 22 have no influence on the output signal of the controller 35.

Figure 8:
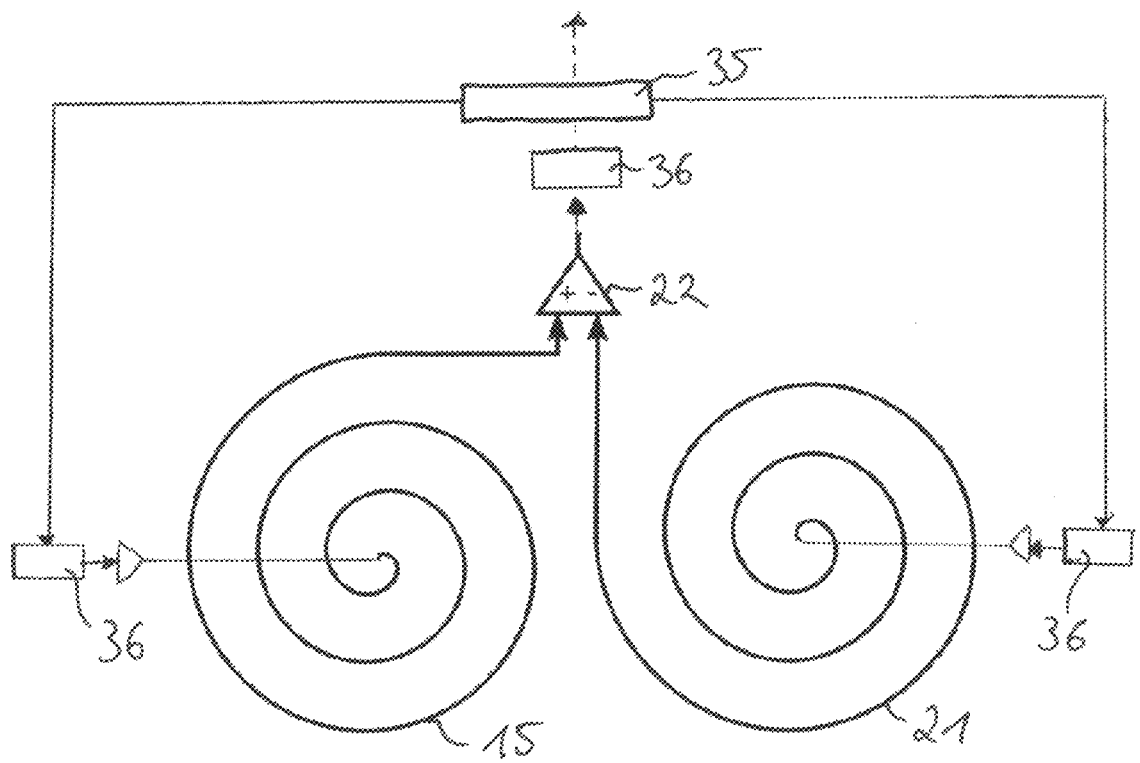

FIG. 8 shows an additional exemplary embodiment of the receiver coil 15 with the additional receiver coil 21. Compared to the exemplary embodiment shown in FIG. 7, the output signal of the differential amplifier 22 is digitized. The differential amplifier 22 is connected to an analog-digital converter 36, which is configured to convert the output signal of the differential amplifier 22 into a digital signal. The analog-digital converter 36 is connected to the controller 35 and configured to supply the digitized output signal to the controller 35. The controller 35 is connected via a digital-analog converter 36 to the other end of the receiver coil 15 and via an additional digital-analog converter 36 to the other end of the additional receiver coil 21. Thus, the ends of the receiver coil 15 and the additional receiver coil 21, which are not connected to the differential amplifier 22, are supplied with an alternating voltage, which has the same frequency as the alternating voltage applied across the transmitter coil 12. The digital-analog converter 36 can also be used to amplify the alternating voltage provided. As in the exemplary embodiment in FIG. 7, the controller 35 regulates the provided alternating voltage in such a way that the output signal of the differential amplifier 22 is always zero. In this case, the bandpass filter of the differential amplifier 22 additionally acts as an anti-aliasing filter for the analog-digital converter 36.

Figure 9:
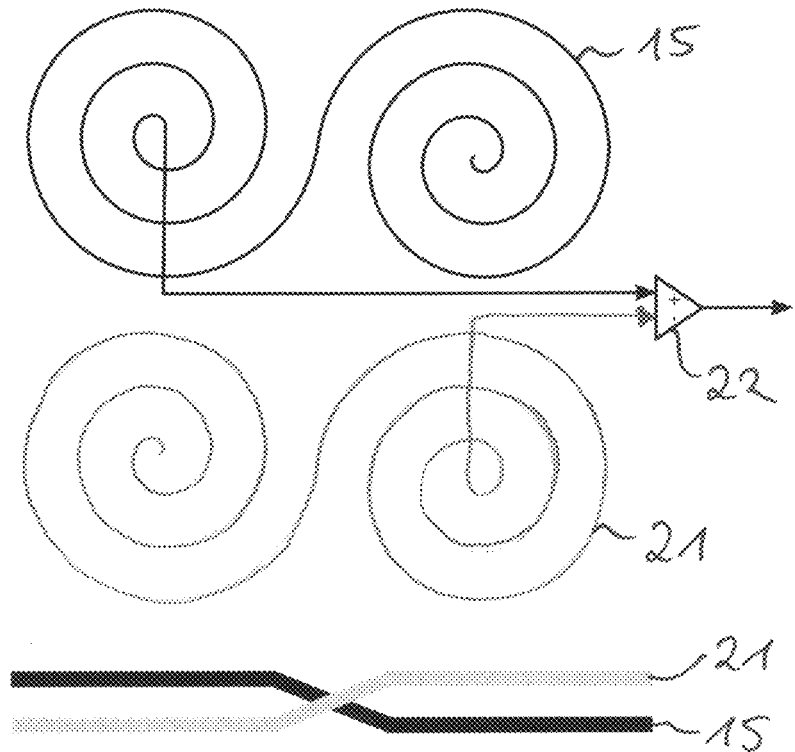

FIG. 9 shows a further exemplary embodiment of the receiver coil 15 with the additional receiver coil 21. The receiver coil 15 and the additional receiver coil 21 have the same construction and the same winding direction. Further, the receiver coil 15 and the additional receiver coil 21 have the shape of a figure eight with two coil halves. If such a coil is arranged in a homogeneous magnetic interference field, the same voltage is induced in both coil halves with different signs. Thus, the two induced voltages compensate each other. The receiver coil 15 and the additional receiver coil 21 are connected to the differential amplifier 22. Compared to the additional receiver coil 21, the other coil half of the receiver coil 15 is connected to the differential amplifier 22, so that the voltages induced in the receiver coil 15 and in the additional receiver coil 21 due to homogeneous fields compensate each other. Below the receiver coil 15 and the additional receiver coil 21, the receiver coil 15 and the additional receiver coil 21 are shown in a schematic side view. It is shown that the receiver coil 15 and the additional receiver coil 21 can be arranged offset one above the other.

Figure 10:
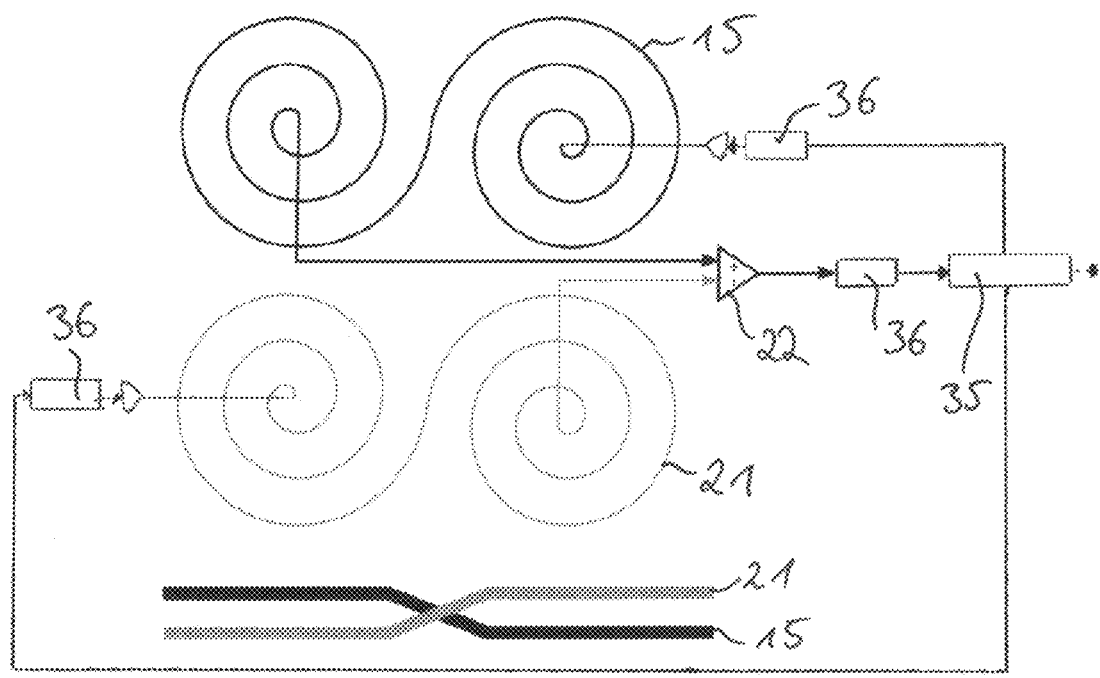

FIG. 10 shows an additional exemplary embodiment of the receiver coil 15 and the additional receiver coil 21. Here, the receiver coil 15 and the additional receiver coil 21 have the construction shown in FIG. 9. In addition, the receiver coil 15 and the additional receiver coil 21 are connected to voltage sources 34 and a controller 35 as shown in FIG. 8.

Figure 11:
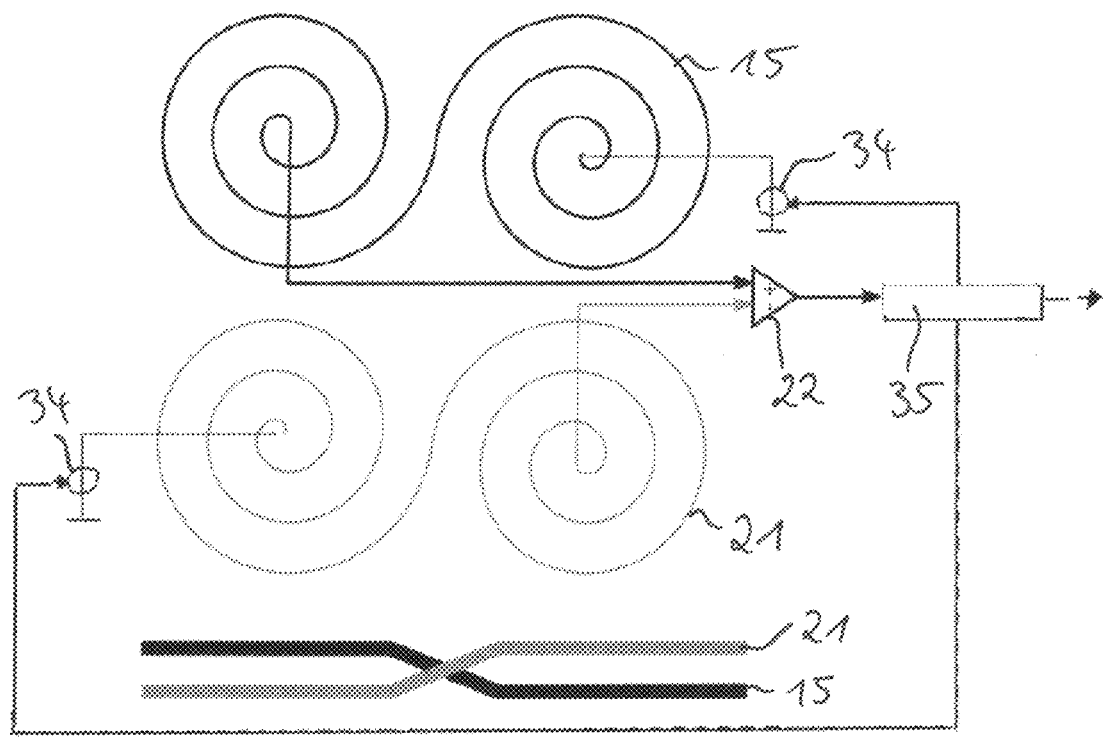

FIG. 11 shows an additional exemplary embodiment of the receiver coil 15 and the additional receiver coil 21. Here, the receiver coil 15 and the additional receiver coil 21 have the construction shown in FIG. 9. In addition, the receiver coil 15 and the additional receiver coil 21 are connected to voltage sources 34 and a controller 35 as shown in FIG. 7.

Figure 12:
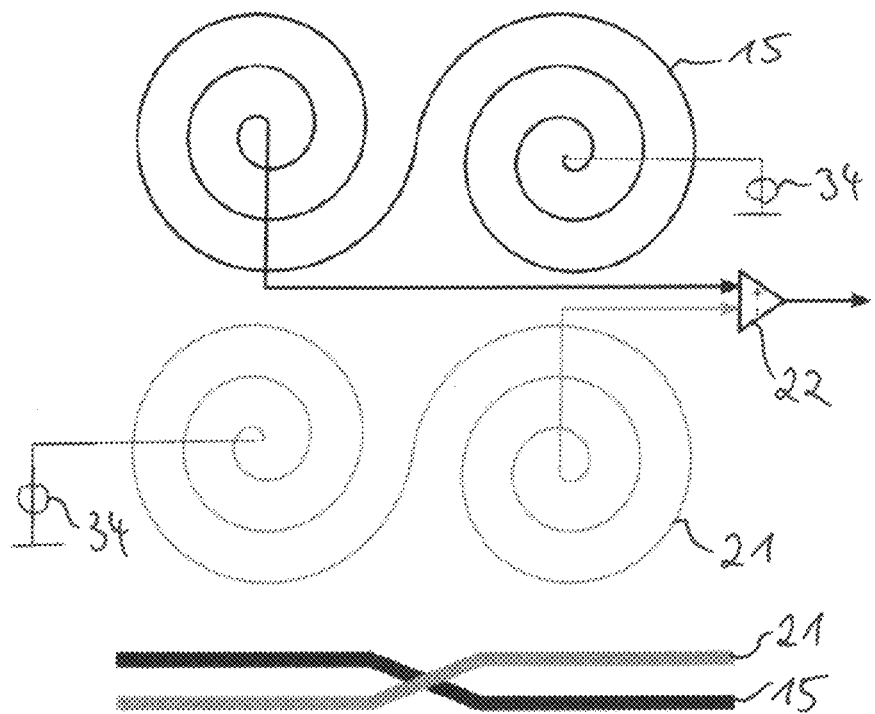

FIG. 12 shows an additional exemplary embodiment of the receiver coil 15 and the additional receiver coil 21. Here, the receiver coil 15 and the additional receiver coil 21 have the construction shown in FIG. 9. In addition, the receiver coil 15 and the additional receiver coil 21 are connected to voltage sources 34 as shown in FIG. 6.

Figure 13:
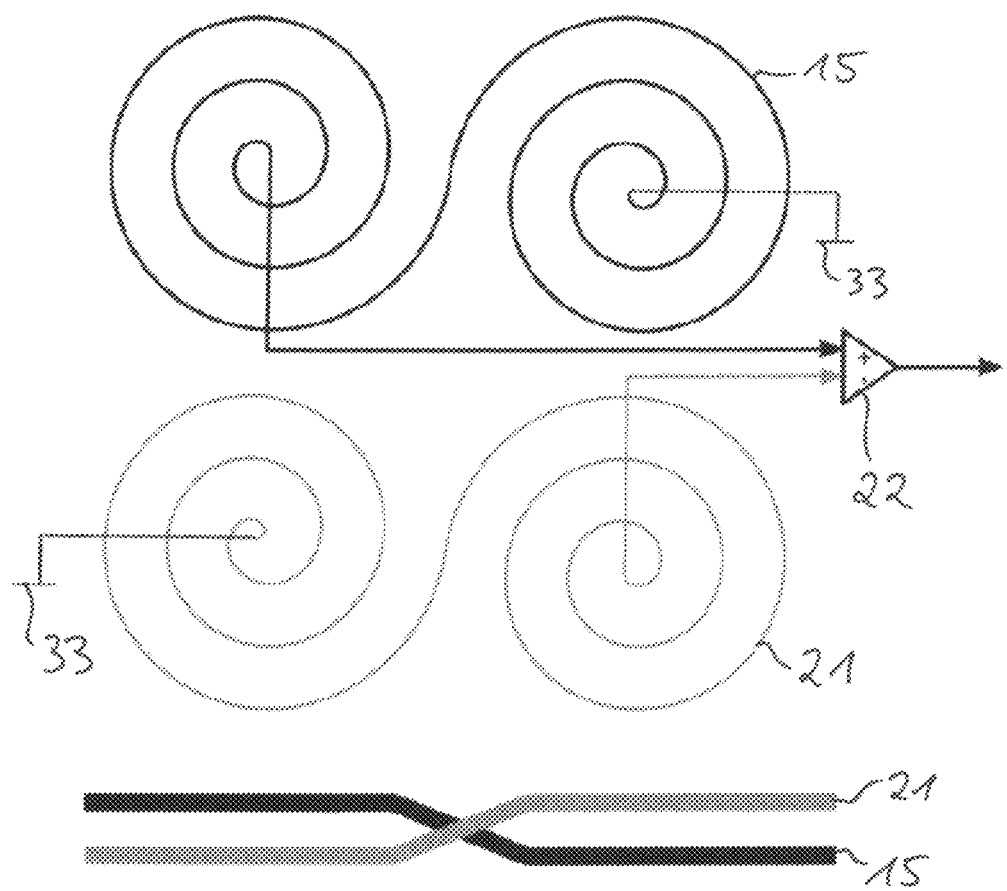

FIG. 13 shows an additional exemplary embodiment of the receiver coil 15 and the additional receiver coil 21. Here, the receiver coil 15 and the additional receiver coil 21 have the construction shown in FIG. 9. In addition, the receiver coil 15 and the additional receiver coil 21 are each connected to a reference potential 33 as shown in FIG. 5.

LIST OF REFERENCE NUMERALS

10: detector
11: transmitter
12: transmitter coil
13: supply source
14: receiver
15: receiver coil
16: evaluation unit
17: additional transmitter
18: additional transmitter coil
19: additional supply source
20: capacitor
21: additional receiver coil
22: differential amplifier
23: first terminal
24: second terminal
25: first input
26: second input
27: first output
28: second output
29: object
30: third input
31: fourth input
32: interfering signal
33: reference potential
34: voltage source
35: controller
36: converter

The invention claimed is:

1. A detector for detecting electrically conductive material, the detector comprising:
at least one transmitter having a transmitter coil and a supply source;
a receiver having a receiver coil; and
an evaluation unit,
wherein:
the transmitter coil is connected to the supply source;
the supply source is configured to provide an alternating voltage or an alternating current when in use;
the receiver is connected to the evaluation unit;
the evaluation unit is configured to detect a signal induced in the receiver coil;
the receiver has an additional receiver coil; and
each of the receiver coil and the additional receiver coil has one end connected to a differential amplifier and the other end connected to a voltage supply.

2. The detector according to claim 1, wherein in use the alternating voltage supplied by the supply source or the alternating current supplied by the supply source is coupled into the transmitter coil.

3. The detector according to claim 1, wherein the transmitter coil is configured to generate a transmitter magnetic field by applying a voltage or a current to the transmitter coil.

4. The detector according to claim 1, wherein the transmitter coil and the receiver coil are arranged such that a transmitter magnetic field generated by the transmitter coil induces a signal in the receiver coil.

5. The detector according to claim 1, wherein the signal induced in the receiver coil depends on electrically conductive material in a vicinity of the receiver coil.

6. The detector according to claim 1, wherein the evaluation unit is configured to provide an output signal, which depends on a change in the signal induced in the receiver coil.

7. The detector according to claim 1, wherein the evaluation unit is configured to determine an amplitude or a phase of the signal induced in the receiver coil.

8. The detector according to claim 1, wherein the detector comprises an additional transmitter which has an additional transmitter coil and an additional supply source.

9. The detector according to claim 8, wherein the additional supply source, when in use, is configured to provide an alternating voltage or an alternating current, a frequency of which differs from a frequency of the alternating voltage provided by the supply source or from the alternating current provided by the supply source.

10. The detector according to claim 1, wherein the transmitter comprises a capacitor which forms an oscillating circuit together with the transmitter coil.

11. The detector according to claim 1, wherein the receiver coil and the additional receiver coil have the same construction.

12. The detector according to claim 1, wherein the receiver coil and the additional receiver coil have the same winding direction.

13. The detector according to claim 1, wherein the evaluation unit comprises the differential amplifier.

14. The detector according to claim 13, wherein the differential amplifier is configured to provide an output signal, wherein the output signal depends on an amplitude and a phase of the signal induced in the receiver coil and on an amplitude and a phase of the signal induced in the additional receiver coil.

15. The detector according to claim 1, wherein a controller is connected to the differential amplifier.

16. The detector according to claim 1, wherein the receiver coil has a shape of a figure eight with two coil halves.

17. A detector for detecting electrically conductive material, the detector comprising:
at least one transmitter having a transmitter coil and a supply source;
a receiver having a receiver coil; and
an evaluation unit,
wherein:
the transmitter coil is connected to the supply source;
the supply source is configured to provide an alternating voltage or an alternating current when in use;
the receiver is connected to the evaluation unit;
the evaluation unit is configured to detect a signal induced in the receiver coil;
the receiver has an additional receiver coil;
the receiver coil and the additional receiver coil have the same construction and the same winding direction;
the evaluation unit has a differential amplifier;
a controller is connected to the differential amplifier;
each of the receiver coil and the additional receiver coil has one end connected to the differential amplifier;
each of the respective other ends of the receiver coil and of the additional receiver coil is connected to a voltage source;
the receiver is configured to operate in such a way that each of the two voltage sources is configured to provide an alternating voltage, and each of the receiver coil and the additional receiver coil is configured to be supplied with the alternating voltage from the respective voltage source; and
a frequency of the alternating voltage for each of the receiver coil and the additional receiver coil is the same as a frequency of the alternating voltage applied across the transmitter coil.

18. The detector according to claim 17, wherein:
the controller is connected to the two voltage sources and is configured to adjust the alternating voltages provided by the two voltage sources; and
the controller is configured to adjust the alternating voltages provided by the two voltage sources such that an output signal of the differential amplifier is zero, in the event that the output signal of the differential amplifier is different from zero.

* * * * *